United States Patent
Sriram et al.

(10) Patent No.: US 10,867,105 B2
(45) Date of Patent: Dec. 15, 2020

(54) REAL-TIME INTERACTIVE ROUTING USING TOPOLOGY-DRIVEN LINE PROBING

(71) Applicant: Synopsys, Inc., Mountain View, CA (US)

(72) Inventors: Mysore Sriram, Bangalore (IN);
Praveen Yadav, Bangalore (IN);
Philippe A. McComber, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/719,786

(22) Filed: Dec. 18, 2019

(65) Prior Publication Data

US 2020/0202064 A1 Jun. 25, 2020

(30) Foreign Application Priority Data

Dec. 19, 2018 (IN) .............................. 201811048230

(51) Int. Cl.
*G06F 30/394* (2020.01)
*G06F 30/3953* (2020.01)

(52) U.S. Cl.
CPC ........ *G06F 30/394* (2020.01); *G06F 30/3953* (2020.01)

(58) Field of Classification Search
CPC .......................... G06F 30/394; G06F 30/3953
See application file for complete search history.

(56) References Cited

U.S. PATENT DOCUMENTS

| | | | | |
|---|---|---|---|---|
| 7,013,451 | B1 * | 3/2006 | Teig ...................... | G06F 30/394 716/129 |
| 7,069,531 | B1 * | 6/2006 | Teig ........................ | G06F 30/18 716/126 |
| 7,107,564 | B1 * | 9/2006 | Teig ...................... | G06F 30/394 716/129 |
| 8,250,514 | B1 * | 8/2012 | Wadland ............... | G06F 30/394 716/131 |
| 2004/0123261 | A1 * | 6/2004 | Alpert ................... | G06F 30/394 716/114 |
| 2009/0319977 | A1 * | 12/2009 | Saxena ................. | G06F 30/394 716/129 |

* cited by examiner

*Primary Examiner* — Stacy Whitmore
(74) *Attorney, Agent, or Firm* — Park, Vaughan, Fleming & Dowler LLP; Laxman Saharabuddhe

(57) ABSTRACT

Techniques and systems for determining a route from a start point to a target point in an integrated circuit (IC) design using topology-driven line probing are described. Some embodiments can create a data structure to store a set of nodes, wherein each node is located on a horizontal probe or a vertical probe, and wherein each node has a cost. The embodiments can then perform a set of operations in an iterative loop, the set of operations comprising: selecting a lowest cost node from the set of nodes; terminating the iterative loop if the lowest cost node is located at the target point; extending a probe from the lowest cost node if the lowest cost node is not located at the target point; creating at least one new node on the probe or on an ancestor of the probe; and adding the new node to the set of nodes.

20 Claims, 11 Drawing Sheets

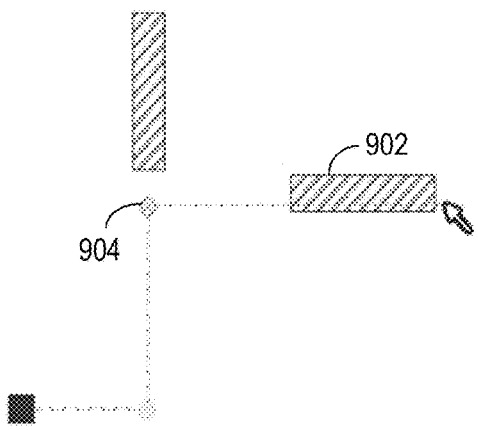

Last two topology edges stretch to reach cursor location

FIG. 9C

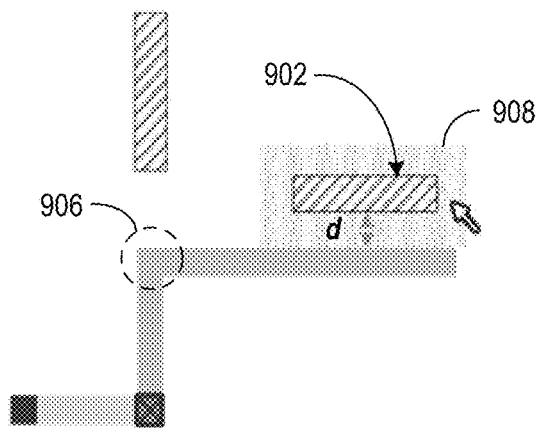

The route is blocked by shape 902, so the user-specified bend location 904 is automatically moved to location 906 to keep a minimum spacing between the route and the shape 902

FIG. 9D

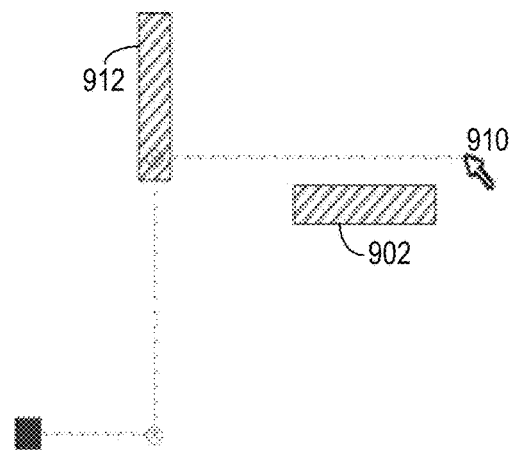

At location 910 of the cursor, the route topology violates design rules with respect to shapes 902 and 912

FIG. 9E

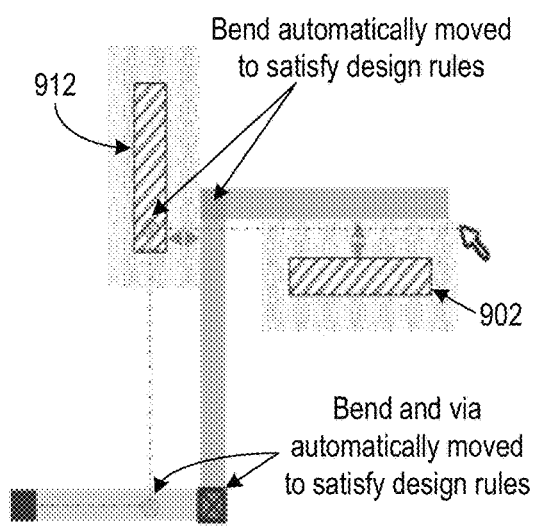

At location 910 of the cursor, the route topology violates design rules with respect to shapes 902 and 912

FIG. 9F

REAL-TIME INTERACTIVE ROUTING USING TOPOLOGY-DRIVEN LINE PROBING

RELATED APPLICATION

This application claims benefit of Indian Provisional Application Serial No. 201811048230, filed on 19 Dec. 2018, the contents of which are herein incorporated by reference in their entirety for all purposes.

COPYRIGHT NOTICE

The assignee of this patent document does not object to the facsimile reproduction of the patent document as it appears in the files of the United States Patent and Trademark Office, but otherwise reserves all rights whatsoever in any included works of authorship protected by copyright.

BACKGROUND

Technical Field

This disclosure relates to integrated circuit (IC) design. More specifically, this disclosure relates to real-time interactive routing using topology-driven line probing.

Related Art

Advances in process technology have fueled a rapid increase in the size and complexity of IC designs. This dramatic increase in complexity and integration densities has made it considerably more challenging to design ICs. IC design tools allow a user to draw routes between circuit objects to electrically connect the circuit objects. The dramatic increase in complexity and integration densities has created a need for more powerful and user friendly IC design tools.

SUMMARY

This section is not intended to limit the scope of the disclosed subject matter. The disclosed subject matter is to be accorded the widest scope consistent with the principles and features disclosed in the entire disclosure. Some embodiments described herein provide systems and techniques that feature real-time interactive routing using topology-driven line probing.

Specifically, some embodiments can determine a route from a start point to a target point in an IC design using topology-driven line probing. The embodiments can create a data structure to store a set of nodes, wherein each node is located on a horizontal probe or a vertical probe, and wherein each node has a cost. Next, the embodiments can perform a set of operations in an iterative loop, wherein the set of operations can comprise: selecting a lowest cost node from the set of nodes, wherein the lowest cost node is located on a first probe; terminating the iterative loop if the lowest cost node is located at the target point; extending a second probe from the lowest cost node, wherein the second probe is orthogonal to the first probe; storing a parent-child relationship between the first probe and the second probe; creating at least one new node on the second probe or an ancestor probe of the second probe; and adding the new node to the set of nodes. In some embodiments, the route from the start point to the target point can be determined by tracing back a sequence of probes from the target point to the start point based on the stored parent-child relationships.

In some embodiments, the cost of each node is equal to a sum of (1) a first cost of a first route from the start point to the node, and (2) a lower bound of a second cost of a second route from the node to the target point.

In some embodiments, creating at least one new node can comprise: (1) creating at least one new node comprises creating the new node on the second probe at a location where the second probe hits an obstacle, (2) creating the new node on the second probe at a location having an X coordinate or a Y coordinate of the target point, (3) creating the new node on an ancestor probe of the second probe (e.g., the first probe, or a parent of the first probe, or a grandparent of the first probe, and so forth) at a location having an X coordinate or a Y coordinate of an edge of an obstacle encountered by the second probe, and/or (4) creating the new node on the second probe at a location having an X coordinate or a Y coordinate of an edge of an obstacle encountered by an ancestor probe of the second probe.

In some embodiments, the second probe and the first probe can be on different routing layers of the IC design. In some embodiments, the different routing layers of the IC design have different unit routing costs.

In some embodiments, the data structure is a priority queue, wherein lower cost corresponds to higher priority so that the lowest cost node is a highest priority node in the priority queue.

Some embodiments can receive a sequence of user inputs that define a route topology in an IC design, wherein the route topology comprises a sequence of topology edges and at least one bend or via. The embodiments can then check if the sequence of topology edges violates one or more design rules. If no design rules have been violated, the embodiments can display routing shapes corresponding to the route topology. On the other hand, if one or more design rules have been violated, the embodiments can move at least one bend or via in the route topology by a minimum distance required to satisfy the one or more design rules, thereby obtaining a design-rule-violation-free route topology. Next, the embodiments can optionally highlight one or more shapes in the IC design that caused the sequence of topology edges to violate the one or more design rules. The embodiments can then display routing shapes corresponding to the design-rule-violation-free route topology.

BRIEF DESCRIPTION OF THE FIGURES

FIGS. 9A-9F illustrate the topology as defined by user inputs and what the user perceives in accordance with some embodiments described herein.

DETAILED DESCRIPTION

Figure 1:
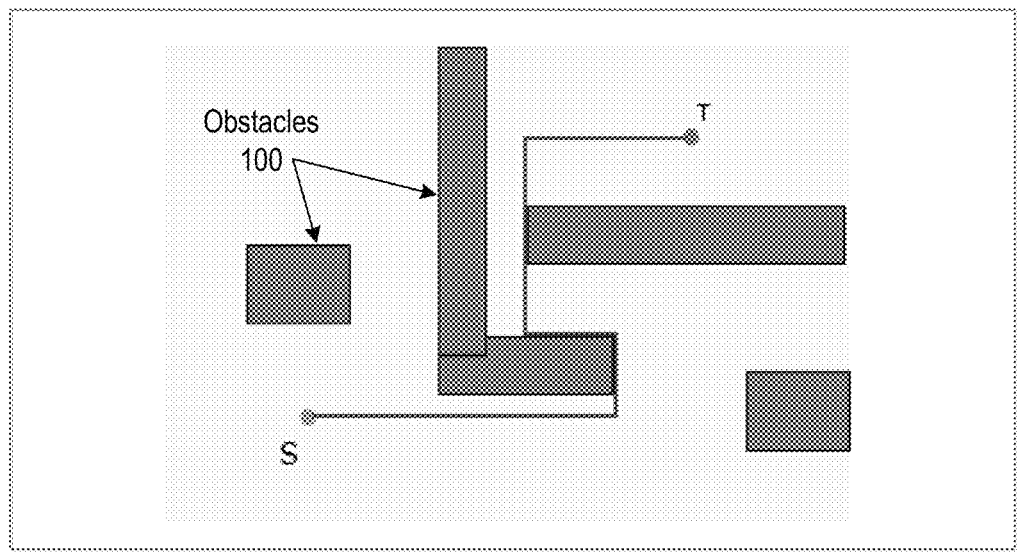
FIG. 1 illustrates planar routing for a single point-to-point connection in accordance with some embodiments described herein.

The following description is presented to enable any person skilled in the art to make and use the claimed invention(s), and is provided in the context of particular application(s) and/or environment(s). Various modifications to the disclosed embodiments will be readily apparent to those skilled in the art, and the general principles defined herein may be applied to other embodiments and applications without departing from the spirit and scope of the disclosure. Thus, the disclosed subject matter is not limited to the embodiments shown, but is to be accorded the widest scope consistent with the principles and features disclosed herein.

In this disclosure, numerous specific details may be described to enable one or more of the embodiments. In the interest of not obscuring the presentation of the embodiments, some features that are known in the art may be combined together, may be described in less detail, or may be implied (i.e., some well-known features may not be explicitly described). Furthermore, while this description may refer to some features in the singular tense, more than one instance of the feature may be illustrated in the figures, and like components are labeled with like numerals.

An IC design and manufacturing process produces IC chips. IC design software tools can be used to create an IC design. Once the IC design is finalized, it can undergo fabrication, packaging, and assembly to produce IC chips. The overall IC design and manufacturing process can involve multiple entities, e.g., one company may create the software for designing ICs, another company may use the software to create the IC design, and yet another company may manufacture IC chips based on the IC design. An IC design flow can include multiple steps, and each step can involve using one or more IC design software tools. An improvement to one or more of these steps in the IC design flow results in an improvement to the overall IC design and manufacturing process. Specifically, the improved IC design and manufacturing process can produce IC chips with a shorter time-to-market (TTM) and/or higher quality of results.

As an IC design progresses through an IC design flow, the IC design can be represented at different levels of abstraction by using different data formats or languages. In general, higher levels of abstraction contain fewer details of the IC design than lower levels of abstraction. Typically, the IC design is described at a high level of abstraction in the early stages of the IC design flow, and the level of abstraction becomes progressively lower as the IC design moves through the IC design flow (i.e., the description of the IC design becomes more specific as the IC design progresses through the IC design flow).

For example, toward the beginning of the IC design flow, an IC design can be described at a high level of abstraction by using a hardware description language (HDL) which describes the functionality of the IC design but does not include information about the actual geometric shapes that will be printed on the wafer. Toward the end of the IC design flow, the same IC design can be represented in a low level of abstraction by using a data format or language such as GDSII or OASIS, which contains a description of the actual geometric shapes that are to be printed on the wafer. In between these two ends of the IC design flow, the IC design may be represented in numerous data formats or languages that describe the same IC design at different levels of abstraction.

Some examples of IC design steps and the associated software tools are described below. These examples are for illustrative purposes only and are not intended to limit the embodiments to the forms disclosed. This disclosure describes techniques and systems that can be used in one or more IC design steps.

IC design software tools enable IC designers to describe the functionality that the IC designers want to implement. These tools also enable IC designers to perform what-if planning to refine functionality, check costs, etc. During logic design and functional verification, the HDL, e.g., SystemVerilog, code can be written and the design can be checked for functional accuracy, e.g., the design can be checked to ensure that it produces the correct outputs.

During synthesis and design for test, the HDL code can be translated to a netlist using one or more IC design software tools. Further, the netlist can be optimized for the target technology, and tests can be designed and implemented to check the finished chips. During netlist verification, the netlist can be checked for compliance with timing constraints and for correspondence (i.e., equivalence checking) with the RTL design and/or HDL code.

During design planning, an overall floorplan for the chip can be constructed and analyzed for timing and top-level routing. During physical implementation, circuit elements can be positioned in the layout and can be electrically connected.

During analysis and extraction, the IC design's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped out" to produce masks which are used during fabrication.

With increasing system-on-chip integration, automatic routing of critical signals at the top level of a chip is becoming an important feature in physical design tools. There are two traditional approaches for performing automated routing: (1) graph-based routing, and (2) shape-based routing. In graph-based routing, all objects in the routing region are pre-processed and a routing graph is created. A graph search technique is then used to find the shortest path between two points or nodes in the graph. In shape-based routing, probes are extended from the start point. When a probe hits an obstacle shape, it stops, and new probes are extended in the perpendicular direction, until the target point is reached.

Graph-based search techniques can guarantee finding the optimal (shortest) route between a pair of points. However, for large designs, the graph creation step can be very expensive in memory and runtime. If this overhead cannot be amortized over a large number of nets, it leads to an inefficient routing system. Shape-based routers do not have any up-front graph creation overhead. However, existing shape-based approaches do not guarantee that probe expansion will find an optimal path. This can lead to routes that are sub-optimal or have too many bends, which may be unacceptable for critical top-level routes such as clocks or major buses.

Custom routing is quickly becoming the most time-consuming and effort-intensive step in the IC design flow. Automating this step is difficult because the designer must precisely control route shapes to achieve desired electrical characteristics of the circuit. At the same time, increasingly complex design rules make drawing detailed routes using a polygon editor extremely tedious. Current custom layout automation approaches typically suffer from one of two drawbacks—they either do not capture user intent with sufficient detail, or they burden the user with having to specify too much detail. In the first case, the automation results are often undesired or unpredictable, leading to rework and lost productivity. In the second case, the automation does not add enough value as the user ends up having to do most of the work, again leading to lower productivity.

Given a routing region with multiple layers, a set of rectilinear obstacles, a set of source and target points, embodiments described herein find a shortest path between each pair of source S and target T, such that the path does not pass through any obstacle. Some embodiments described herein include the following features and advantages: (1) the startup time to begin the search is essentially zero, because the technique does not require any pre-processing of the region to create a graph, (2) preferred and non-preferred routing orientations are supported on each layer, and different costs on different layers are also supported, (3) no assumptions are made about the presence of a routing grid, i.e., if a grid is present, it will be used, but it is not required. Finally, and maybe most importantly, the embodiments described herein can guarantee that the path from S to T is a minimal-cost path. This is a very important feature when routing critical signals and buses: even a small deviation from the optimal path could impact chip timing, or waste precious routing area in the floorplan.

Specifically, it can be proven, by using mathematical induction, that the routing solution found by the embodiments disclosed herein is indeed optimal in realistic routing scenarios. Note that the optimality of the solution does not come at the expense of the runtime—in fact, the embodiments are faster than existing shape-based approaches.

Some embodiments described herein feature an interactive router that allows the user to define a flexible topology guide on the layout canvas. As the user builds up this guide using a sequence of mouse movements and keystrokes, a topology-constrained search engine computes and displays a design rule clean route that deviates minimally from the user-defined topology. The topology guide itself is invisible to the user, thereby giving the user the impression of a "What you See Is What You Get" (WYSIWYG) router that follows the cursor in real time with a predictable design-rule-clean route path.

Since the sequence of routing layers used by the router is constrained to match those in the topology defined by the user, the user has precise and direct control over the routing result. However, since the router has the freedom to deviate from the exact locations of the topology edges, it can find a design-rule clean path that is as close to the topology as possible. The user is therefore relieved from the burden of having to understand complex design rules and having to precisely click on the canvas to satisfy these rules.

The use of the topology-constrained line probe search engine is an important enabler for the interactive router. The efficiency of line probing is further improved in the interactive router by constraining the line probe engine to exactly match the sequence of bends and vias specified in the topology and modifying the objective function to minimize deviation from the specified bend and via locations. These changes further reduce the search space of an already highly efficient routing process, resulting in a very responsive interface for the user as they move the mouse. Topology-constrained line probing also allows the router to scale up very well to large design sizes.

The combination of flexible topology and line probe search has an additional benefit, which is particularly valued by users. The routes generated by the interactive router tend to "hug" the boundaries of obstacles (such as blockages or previously drawn routes) precisely, resulting in compact layout with no wasted space. This is achieved automatically, with no special effort required from the user.

For the user, the direct benefits of the embodiments disclosed herein include better productivity, compact layout, and reduced strain on the eyes and hands, since the embodiments do not require users to make any precise measurements while drawing. From a product development perspective, the topology-based approach described herein provides a foundation for implementing multiple advanced editing features, including bus, shield and tandem routing, real-time shove-aside editing, and automatic update of routing when the floorplan changes.

FIG. 1 illustrates planar routing for a single point-to-point connection in accordance with some embodiments described herein. Consider two points S and T in a 2-D plane. Obstacles (which may overlap each other), e.g., obstacles 100, are distributed at various locations in the plane. The objective in the planar routing problem is to find a shortest path joining S and T (if a path exists), such that the path does not cross any obstacle.

As mentioned above, routing approaches for solving the planar routing problem can be broadly classified as graph-based or shape-based. Graph-based approaches pre-process the region to build a routing graph, and then use variations of breadth-first search on the graph to find a shortest path from S to T. Graph-based approaches work well when there are a large number of nets to be routed, since the runtime and memory overhead of the initial graph construction can be amortized over a large number of nets. Graph-based algorithms also guarantee that the path found will have the minimum cost, which is an important consideration when the quality of the route is important.

When a relatively small set of nets needs to be routed, the computational overhead of graph-based approaches can be prohibitively high. In such cases, shape-based approaches are popular, because these approaches do not require building a graph up-front. Shape-based approaches, such as line probing, typically involve extending probes towards the target, and changing the direction of a probe when the probe hits an obstacle. Line probing is a fast technique but does not guarantee that a path will be found even if it exists. Even if a path is found, there is no guarantee that the path will be optimal. Sub-optimal routes can cause significant problems for chip timing and area.

Some embodiments describe herein feature an enhanced line probing technique that is guaranteed to find a shortest path, if a path exists. The line probing technique that is used in some of the embodiments is referred to as the OLP technique in this disclosure, and is both shape-based and optimal, making it ideal for routing critical nets which require high-quality routes. OLP is also very efficient computationally as it runs several times faster than existing state-of-the-art commercial shape-based routers.

The OLP technique is first described in the context of a single-layer search, and then a general multi-layer OLP technique is described that can accommodate different horizontal (hereinafter "H") and vertical (hereinafter "V") costs on each routing layer.

Figure 2A:
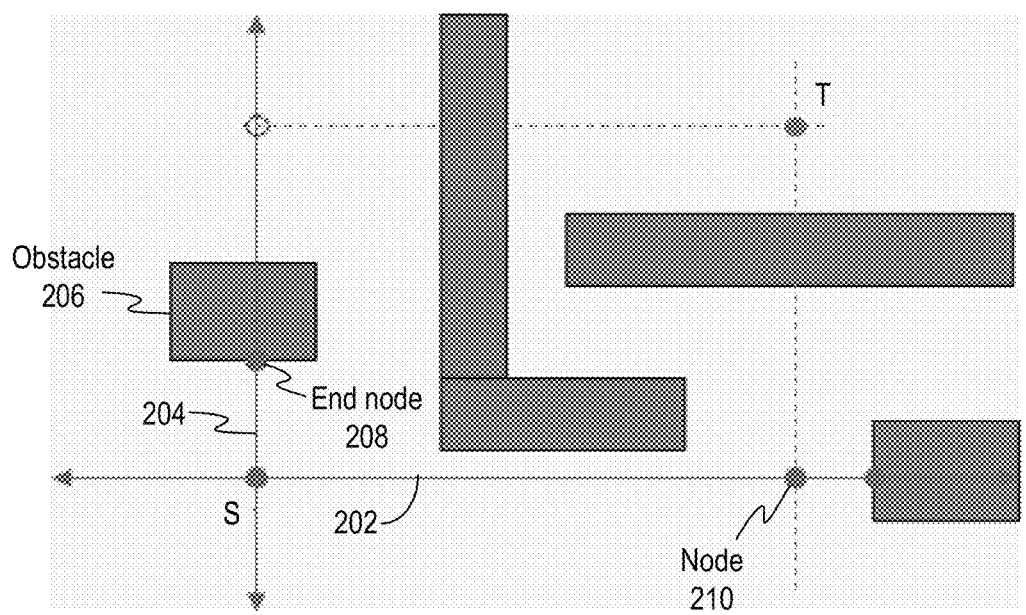
FIGS. 2A-2C illustrate an example of using the Optimal Line Probing (OLP) technique in accordance with some embodiments described herein.
Figure 2B:
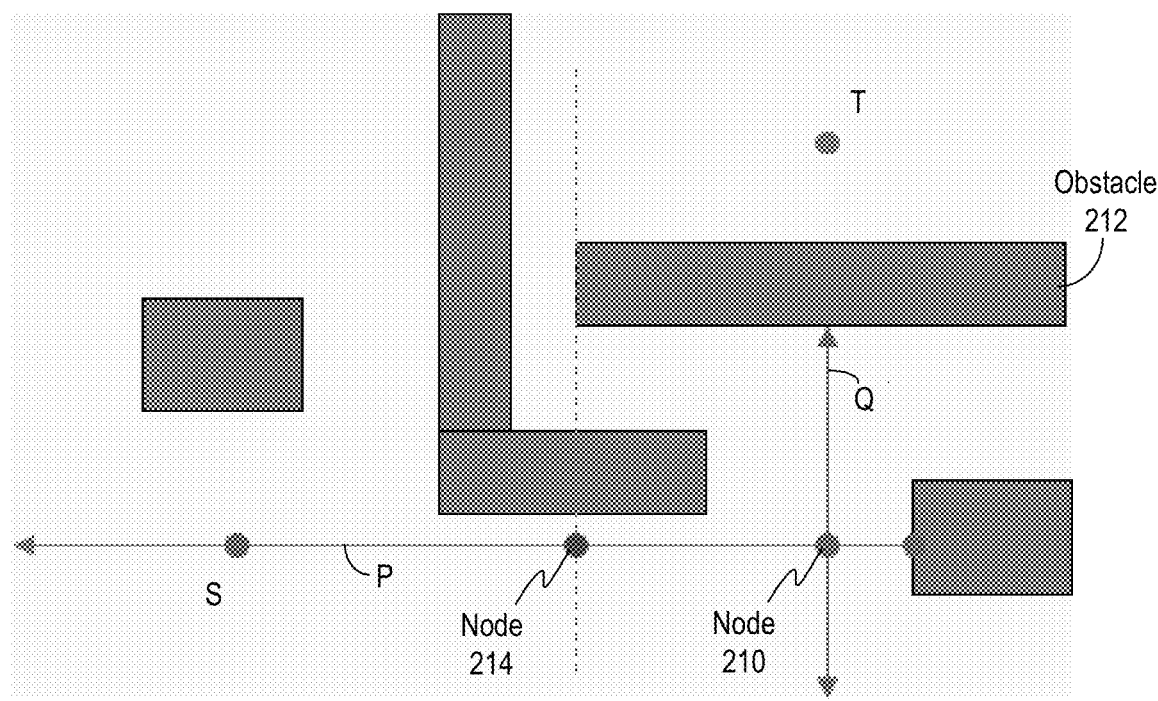
Figure 2C:
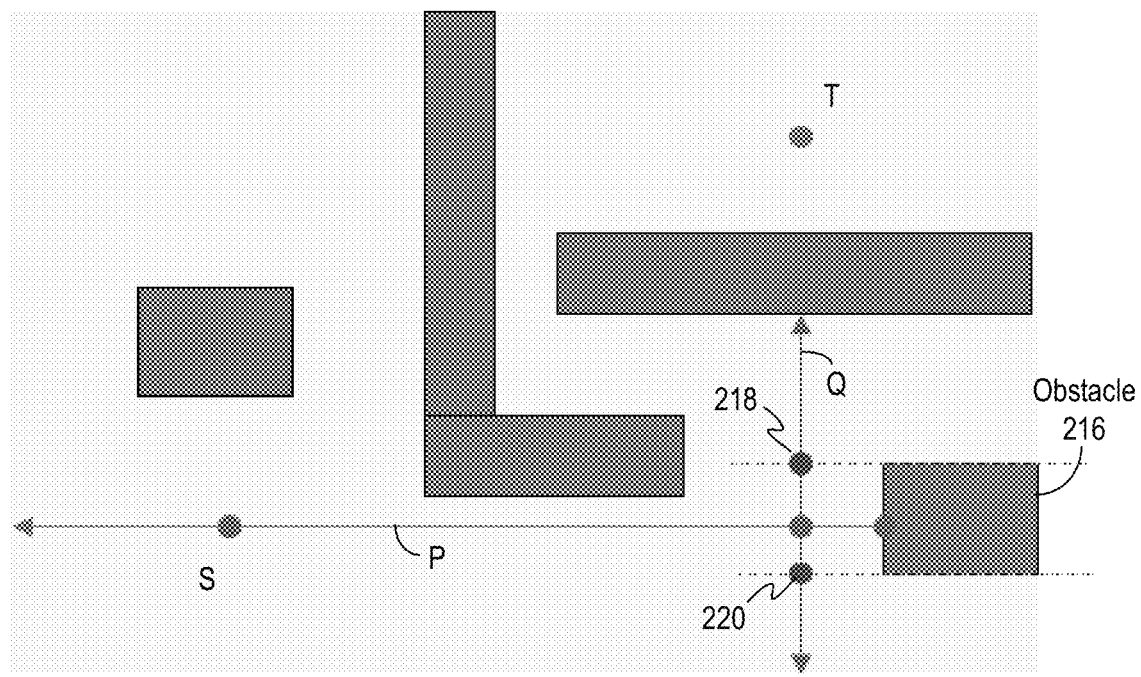

FIGS. 2A-2C illustrate an example of using the OLP technique in accordance with some embodiments described herein. The technique can begin by extending horizontal line probe 202 and vertical line probe 204 from the source node S. The origin of these probes is the point S, and the probes extend from the origin point, all the way to the left/lower edge and the right/upper edge of the routing region.

If a probe hits an obstacle, an end node is created on the probe at the point where the line crosses the obstacle boundary. For example, end node 208 is created when the vertical probe 204 hits obstacle 206. The probe segment of the line probe is defined as the part of the probe lying between the lower/left and upper/right end nodes (if the probe does not hit an obstacle in a direction, the probe segment is defined to extend till the region boundary in that direction).

In addition to the end nodes, for any H or V probe, if the probe segment contains the target point's X or Y coordinate, a node is created on the probe at the corresponding X or Y coordinate. In FIG. 2A, the horizontal probe 202 contains the X coordinate of the target point T, so node 210 is created at that point. The vertical probe segment does not cross the Y coordinate of T, so no node is created on the vertical probe.

Each node has a cost, which has at least two components: g and h. The first component, g, is the total accumulated cost of reaching node, N, from S, and the second component, h, is the lower bound of estimated cost of reaching T from N. The value of "g" can be determined by computing the cost of each segment along the route from source S to the current location. The value of "h" can be determined by computing the minimum cost of a one or two segment Manhattan route from the current location to T (the minimum cost Manhattan route will have only one segment if either the X or Y coordinate of the current location matches the X or Y coordinate of T; otherwise the minimum cost Manhattan route will have two segments). If different layers have different costs, then for computing the lower bound, the cheapest horizontal cost can be selected for the horizontal segment and the cheapest vertical cost can be selected for the vertical segment.

FIG. 2B illustrates how new line probes can be expanded. Nodes can be inserted into a priority queue, sorted by their total cost (g+h) (ties are broken by the lower h cost). In other words, lower cost can correspond to higher priority in the priority queue. The lowest cost node N is popped from the queue, and a new line probe Q is expanded, orthogonal to the direction of the owner probe P of N. The probe Q is defined to be the child of P, and P is the parent of Q. The expansion depth of a probe P is the number of probes (including P) along the back-trace from P to the first probe in the expansion.

Suppose a vertical probe Q hits obstacle 212 as shown in FIG. 2B. If the X coordinate of the left or right edge of obstacle 212 lies inside the probe segment of Q's parent P (which is a horizontal probe), then an additional node is created at that coordinate on P. For example, node 214 can be created in this manner in FIG. 2B. Creating nodes in a parent (or ancestor) probe based on the edges of an obstacle that the current probe hit is known as backward propagation.

In some cases, such as that shown in FIG. 2C, probe Q may need to know the Y-coordinates of the obstacle hit by its parent P. So, each probe stores the coordinates of the obstacles that it hits, for forward propagation to its children when needed. In forward propagation, a node is created in a child (or descendant) probe based on the edges of an obstacle that the current probe hit. For example, in FIG. 2C, probe P hits obstacle 216, and nodes 218 and 220 are created in the child probe Q based on the top and bottom edges of obstacle 216. Note that the edges of an obstacle are parallel to the probe that was blocked by the obstacle. So, the top and bottom edges of obstacle 216 are used for horizontal probe P, whereas the left and right edges are used for vertical probe Q.

Nodes are stored in a spatial data structure and marked with a flag when they are expanded. Once a node is marked, it cannot be inserted into the priority queue again. Nodes created by forward and backward propagation are also inserted into the priority queue. The search terminates when the node popped from the queue has the same coordinates as the target point. The path from S to T is reconstructed by tracing the probes backwards from T to S.

A generalization of the planer OLP technique to multiple layers is now described, wherein successive layer orientations alternate between H and V, and all layer costs are identical. On an H layer, only H probes are expanded, and vice versa. Transitions from one layer to the next or previous layer in the stack are made using via probes, whose orientation is either Up or Down (U or D).

As with planar OLP, we start at the source point S, create a node at that (x, y, z) location, and insert the node into the priority queue. At each step, the OLP process pops the lowest cost node N from the queue, and expands a line probe in the orientation of the layer of N, and one or two via probes. If the predecessor node of N is on the same layer as N (or if N is the source node), then two via probes are expanded—one up and one down. If the predecessor node is on the layer below N, then only an up via probe is expanded, else only a down via probe is expanded.

Expanding a line probe P is exactly the same as in the planar case: when P hits an obstacle, an end node is created at the intersection point. A node that is aligned with the target is created on the probe if the probe segment contains the target's X or Y coordinates. The end-nodes and target-aligned nodes are defined to be owned by the line probe P and are inserted into the priority queue.

Expanding a via probe (x, y, z, U/D) from a node N (x, y, z) means checking the legality of placing a via-up/via-down at that location. If the via is legal, a node NN is created at (x, y, z±1), and inserted into the node priority queue. Note that NN inherits its owner probe from N, i.e., only line probes are allowed to own nodes. In the case of a stacked via, where vias are placed one on top of the other at the same (x, y) location, we need to trace back through the whole stack to find the parent line probe. Note that via probes do not participate in parent-child relationships. The parent P of a probe Q originating from a node N is simply the owner probe of the node N: we may need to trace back through via probes until we find a line probe. With this definition of parent-child relationships between line probes in place, the backward propagation procedure can now be defined.

Figure 3:
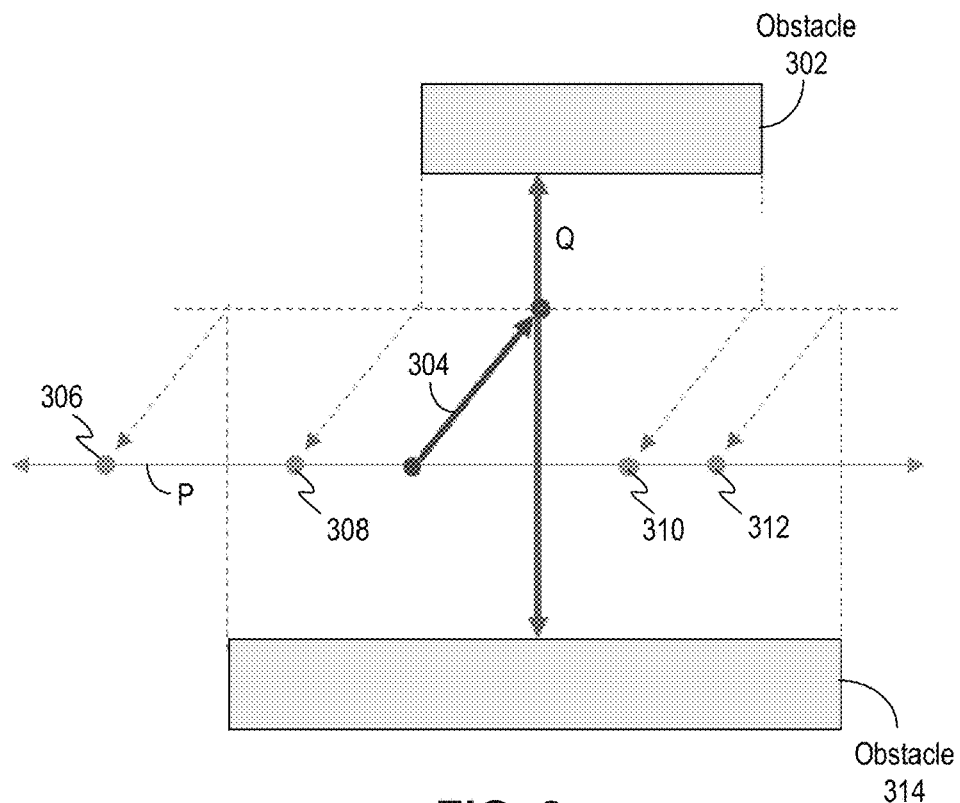
FIG. 3 illustrates propagation in the presence of multiple layers in accordance with some embodiments described herein.

FIG. 3 illustrates propagation in the presence of multiple layers in accordance with some embodiments described herein. Suppose a vertical probe Q hits obstacle 302. The X coordinates of obstacle 302 are propagated to horizontal ancestor probes of Q, by tracing backwards along the parent probes until a horizontal ancestor is found whose probe segment does not contain the centerline X coordinate of Q. FIG. 3 shows backward propagation from a vertical probe Q to a horizontal ancestor P. Arrow 304 indicates a path comprising of multiple via and line probes. Every horizontal segment along this path must contain the X coordinate of Q. As shown in FIG. 3, nodes 308 and 310 were created on ancestor probe P based on the edges of obstacle 302 that probe Q hit. Nodes 306 and 312 were created on ancestor probe P based on the edges of obstacle 314 that probe Q hit.

Figure 4:
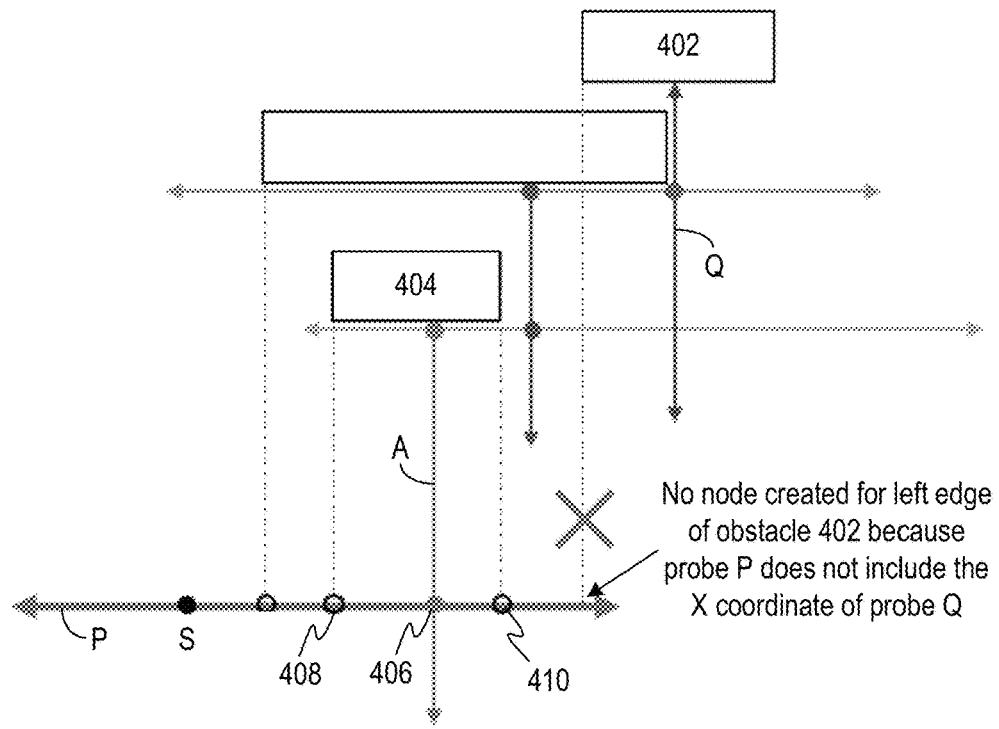
FIG. 4 illustrates a top view of multiple vertical probes on different layers propagating their obstacle coordinates back to a horizontal probe in accordance with some embodiments described herein.

FIG. 4 illustrates a top view of multiple vertical probes on different layers propagating their obstacle coordinates back to a horizontal probe in accordance with some embodiments described herein. The horizontal probe P is on one of the layers in the IC design, and the vertical probes (Q is one of the vertical probes shown in FIG. 4) are on other layers. The probe Q does not propagate its coordinates to probe P because probe P does not contain the X coordinate of probe Q. Additionally, probe Q hits obstacle 402, and the edges of obstacle 402 are also not back propagated to probe P, as shown in FIG. 4. On the other hand, probe P contains the X coordinates of probe A. Therefore, node 406 is created on probe P that corresponds to the X coordinate of probe A. Also, probe A hits obstacle 404, and back propagation is used to create nodes 408 and 410 on probe P corresponding to the left and right edges of obstacle 404, respectively.

Figure 5:
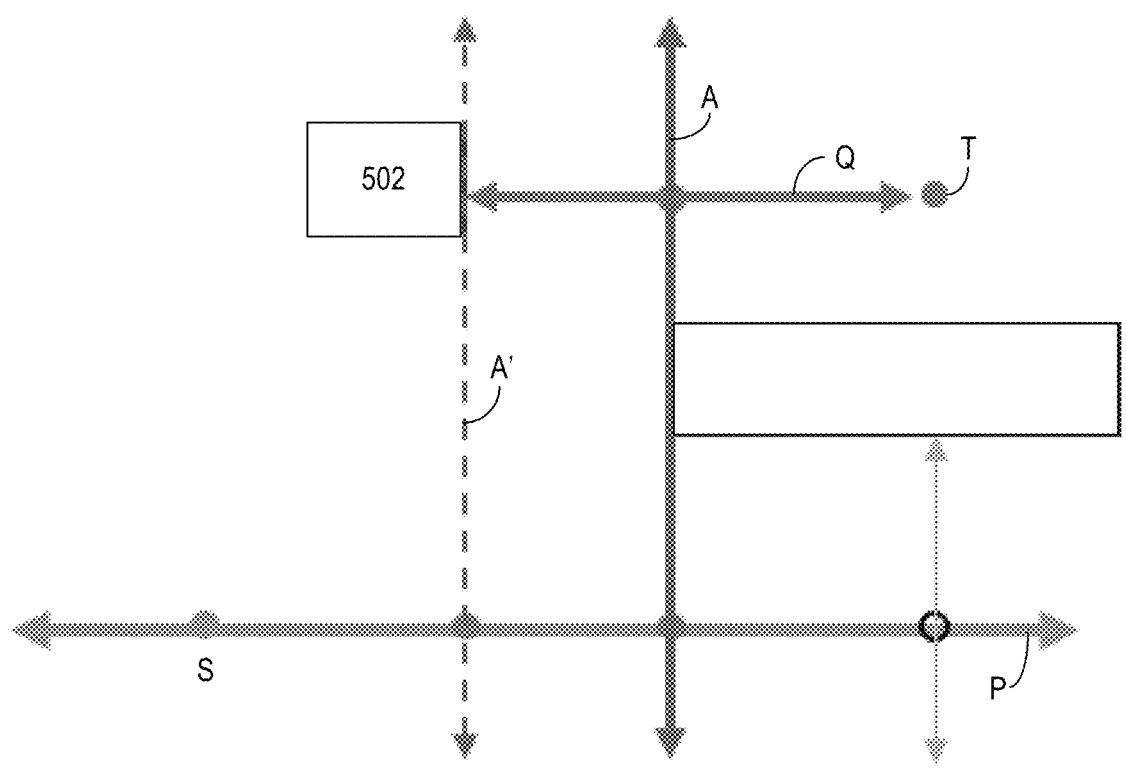
FIG. 5 illustrates how different layer costs can be handled in accordance with some embodiments described herein.

FIG. 5 illustrates how different layer costs can be handled in accordance with some embodiments described herein. Specifically, some embodiments can handle different layer costs by modifying the coordinate propagation process. The intuition behind the modification can be understood based on the following example. Consider two horizontal probes P (on layer L) and Q (on layer L+2), as shown in FIG. 5. Let us assume that the cost of layer L is greater than the cost of layer L+2. The route from S to T that is determined by the propagation technique described above is shown by the solid lines corresponding to probes P, A, and Q. Note that this is not the lowest cost solution. Specifically, sliding the vertical probe to the left (i.e., probe A' shown with a dashed line) would result in a lower cost solution because that solution has a shorter length on layer L, which is cheaper than layer L+2. One way to modify the propagation technique so that it arrives at this solution is to propagate the X coordinates of obstacle 502 back to probe P. In other words, in the modified propagation procedure, the X coordinates of obstacles hit by horizontal probes are propagated back to horizontal ancestor probes in addition to being propagated back to the vertical probe ancestors as was the case in the propagation procedure that was described earlier. Likewise, obstacles hit by vertical probes are propagated back to vertical ancestor probes in addition to being propagated back to the horizontal probe ancestors. The modified coordinate propagation procedures thus requires probe obstacle coordinates to be propagated to both vertical and horizontal ancestor and descendant probes.

Figure 6:
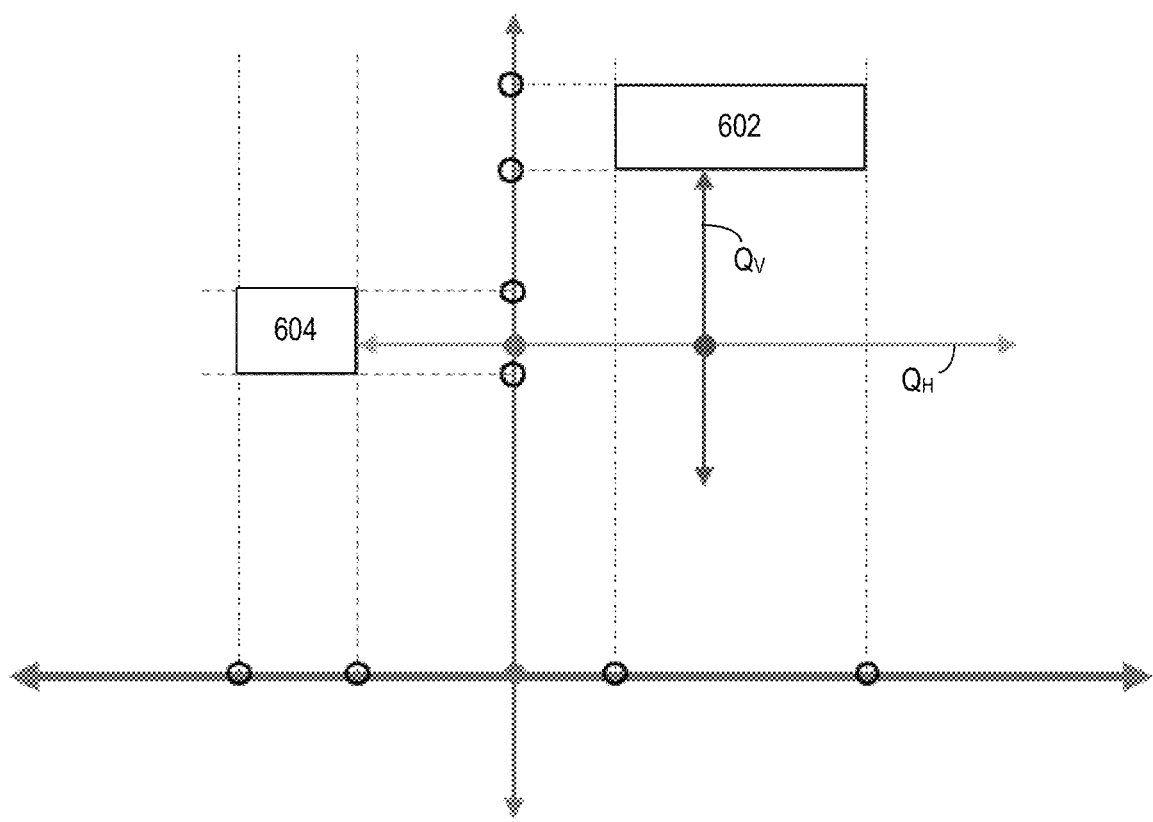
FIG. 6 illustrates how coordinate propagation can be performed in accordance with some embodiments described herein.

FIG. 6 illustrates how coordinate propagation can be performed in accordance with some embodiments described herein. A procedure for propagation of X coordinates is described below. A similar process applies for Y coordinates. If a vertical probe $Q_V$ hits an obstacle 602, the X coordinates of obstacle 602 are propagated to horizontal ancestor probes of $Q_V$, by tracing backwards along the parent probes until a horizontal ancestor is found whose probe segment does not contain the centerline X coordinate of $Q_V$.

If a horizontal probe $Q_H$ hits obstacle 604, the X coordinates of obstacle 604 are propagated to horizontal ancestor probes of $Q_H$, by tracing backwards along the parent probes until a horizontal ancestor is found whose probe segment does not contain the X coordinate of $Q_H$.

The routing process can also be extended to allow bidirectional routing. Since the typical process nodes and routing layers will have a strong preferred orientation (H or V), with non-preferred direction routing having a much higher cost and allowed over shorter distances, this situation can be handled as follows. Non-preferred direction expansion will happen through segment probes—short probes whose length is determined by factors like track pitch, minimum segment length design rules or width/spacing. As an example, the maximum probe length in the non-preferred orientation could be limited to two track pitches, with a higher cost than the preferred orientation. This would be sufficient to escape from off-grid pins or create planar jogs, but not long enough to significantly impact optimality of the final solution.

Figure 7:
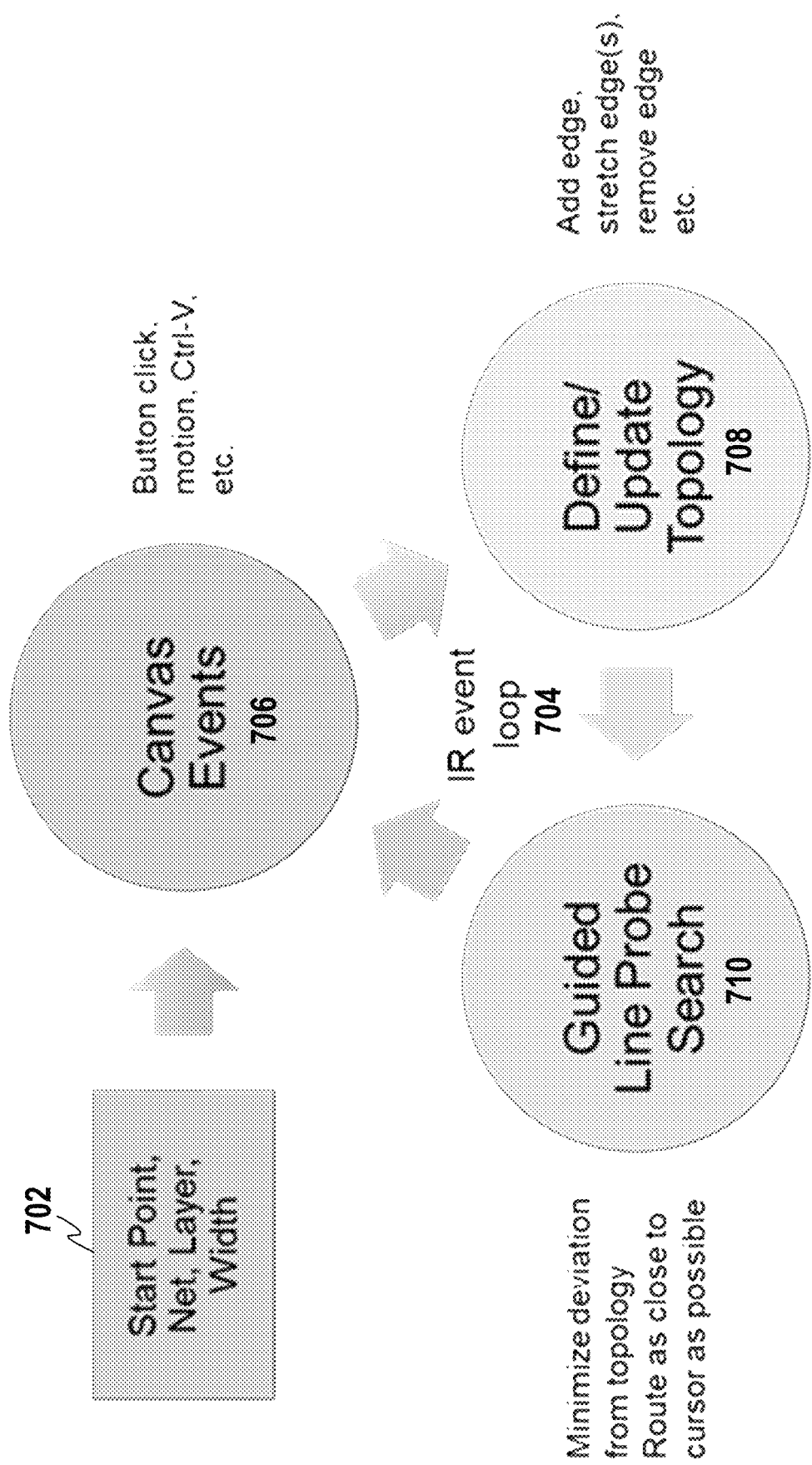
FIG. 7 illustrates an interactive router in accordance with some embodiments described herein.

FIG. 7 illustrates an interactive router in accordance with some embodiments described herein. In the context of the interactive router, the term "topology" or "topology object" refers to the route that the user is trying to create in the IC design tool, and the term "topology edge" corresponds a single straight line segment of the route.

When the user invokes the Interactive Router (IR) command from the "Router" menu in the graphical user interface (GUI) of the IC design tool, they can start drawing a route in one of two ways. (1) Click on an existing shape of a net (the term "click" refers to a selection operation that can be performed by selecting a button of a pointing device (e.g., by pressing the button) that allows a user to move a pointer or cursor in the GUI). In this case, the current net, width, and layer are inherited from the shape, and the start point is computed to align the route to the shape. (2) Select a net from the "Design Navigator" section of the GUI (which is a GUI section that allows the user to browse, search, and select objects in the IC design), a valid routing layer from the "Layer Panel" section of the GUI, and a width from the "Options Toolbar" section of the GUI. Then select any location on the IC design canvas section of the GUI to indicate the start point.

In the IC design tool, the start point, layer, and current width are recorded in a topology object. At this stage, the topology comprises a single point (the start point), and an implicit topology edge joining the start point to the current cursor location.

After the start point has been defined by the first click (state 702), the router enters the IR event loop 704 that comprises states 706, 708, and 710. The user can perform the following actions while in the event loop.

In state 706, canvas events are captured. Specifically, in this state, the user can select keys (e.g., by pressing keys of a pressure-based keyboard) to insert bends and vias. For example, a "Shift-v" keystroke can insert an up-via at the current cursor location, and the topology object can be augmented with a new point. Each point has an attribute indicating whether it is a bend, up-via or down-via. Each new point is snapped such that it is either horizontally or vertically aligned to its predecessor, i.e., every topology edge joining two successive topology points is either H or V. The last point in the topology is joined to the cursor location by an implicit topology edge.

In state 706, the user can also move the mouse. As the cursor moves, the topology is updated in real time to track the cursor location by stretching (or shrinking) the last (implicit) topology edge, and the most recent topology edge perpendicular to the implicit topology edge. Among the possible topology update strategies, this strategy leads to the most intuitive behavior of the router. In this state, the user can also change the current width of the route.

Specifically, by using the mouse scroll wheel, the user can increase or decrease the width of the current route segment to any value that is legal for the current layer. This width is stored as an attribute on the most recent point in the topology object. The "<Backspace>" can be used to delete the last inserted point from the topology object. If the topology object only had one point (the start point), then selecting this key causes the IR to exit the event loop. The user can also select the "<Return>" key to save the route created so far to the design database and exit the event loop. Finally, the "<Escape>" key can be selected to discards the current route and exits the IR command.

After an event is captured by the canvas events state 706, the updated topology is passed to a topology-constrained line probe (TCLP) router, which attempts to find a design-rule clean route that begins from the start point and has the exact sequence of bends and vias specified in the topology. The TCLP algorithm is an extension of the line probe process described earlier.

In TCLP, every line probe corresponds to a specific topology edge in the topology object. The procedure to compute child probes of a line probe is modified as follows. Consider a line probe P corresponding to topology edge k of the topology object. The child probes of P created by TCLP will be on the layer of topology edge (k+1).

Figure 8:
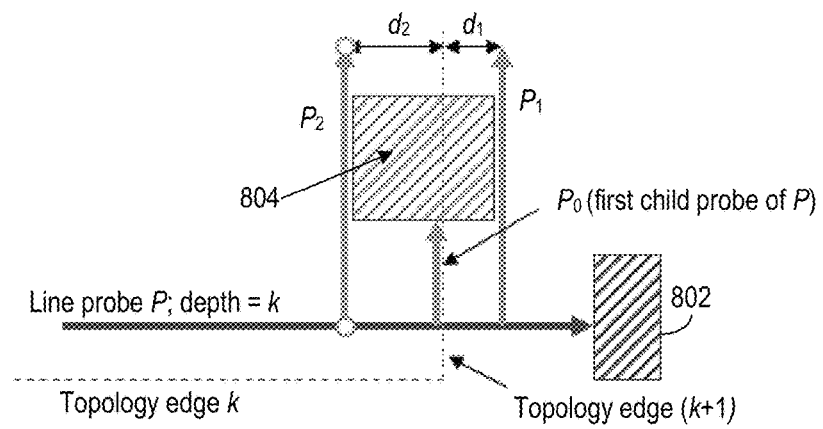
FIG. 8 illustrates how child probes can be created in accordance with some embodiments described herein.

FIG. 8 illustrates how child probes can be created in accordance with some embodiments described herein. In FIG. 8, line probe P and obstacle 802 are on the same layer as topology edge k, and child probes $P_0$, $P_1$, and $P_2$, and obstacle 804 are on the same layer as topology edge (k+1). The topology edges are shown using dashed lines, and line probes using solid arrows. Probe P is at depth k, i.e., it corresponds to the kth topology edge. The first child probe $P_0$ of P will be created on the layer of topology edge (k+1) at a point on probe P which is as close as possible to the centerline of topology edge (k+1) (note that a topology edge can have a width; therefore, the centerline of the topology edge is used for calculating distances so that the distance calculation does not depend on the width of the topology edge). If this child probe is expanded and hits obstacle 804, as shown in FIG. 8, this can result in up to two additional child probes $P_1$ and $P_2$ that are created on probe P, depending on the dimensions of the obstacle.

The cost of the child probes depends on how much they deviate from the centerline of their corresponding topology edge. For example, the child probe $P_1$ can have a cost equal to the cost of P, plus a cost corresponding to the distance $d_1$. Child probes are inserted into a probe priority queue sorted by cost. At each step, the lowest cost probe is chosen for expansion. Since, in the example shown in FIG. 8, $P_1$ has a lower cost than $P_2$, probe $P_1$ is expanded before probe $P_2$. The TCLP search terminates when the lowest cost probe in the priority queue has a depth equal to N+1, where N is the number of topology edges. This probe, and its chain of predecessor probes of decreasing depth, are returned to the event loop state machine.

Figures 9A, 9B:
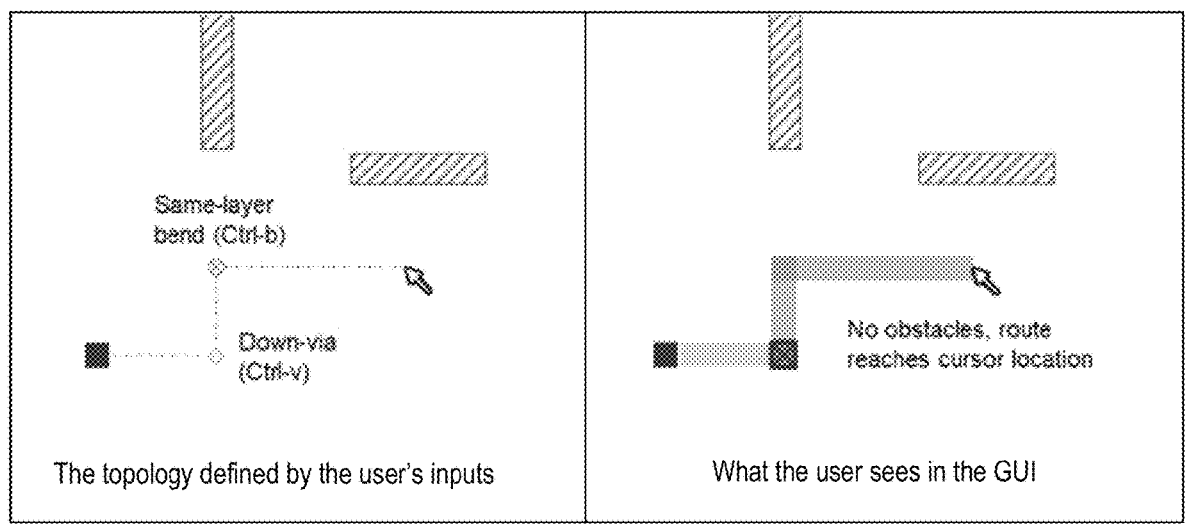

FIGS. 9A-9F illustrate the topology as defined by user inputs and what the user perceives in accordance with some embodiments described herein. The route update and display process is now described in reference to FIGS. 9A-9F. After each canvas event, when TCLP computes and returns a new route to the event loop, the previous route is erased from the canvas and the new route is displayed. The topology creation and update process is invisible to the user—all the user perceives is route shapes following the cursor in real time, in a smooth and predictable way, with vias and bends staying as close as possible to their desired location. For example, FIG. 9A shows the inputs provided by the user through the GUI, and FIG. 9B shows the route shapes that are created and displayed to the user in real time.

When there are obstacles blocking the path, the route gracefully adapts and finds a solution that "hugs" the obstacle and gets as close to the cursor as possible. This "contouring" behavior is especially beneficial to users as the routes will tend to stay at minimum design rule spacing to obstacles and previously routed nets, without requiring any special effort on the part of the user. This results in very compact layout with no wastage of space. In FIG. 9C, as the user moves the mouse up and to the right, the last two topology edges of the topology stretch, so that the topology end point tracks the cursor location. The router is unable to reach the exact cursor location because that point is blocked by shape 902. Instead, as shown in FIG. 9D, TCLP finds a route that stays a legal distance d away from the shape, gets as close to the cursor as possible, and deviates minimally from the topology bend point by moving the bend point from location 904 to location 906. The shape preventing the route from reaching the cursor is highlighted (e.g., by using shaded region 908 that extends around shape 902), as a visual cue that the route is "hugging" shape 902 to try and get close to the cursor. This illustrates the contouring behavior of the router.

In FIG. 9E, the user continues to move the mouse upwards past shape 902 and then to the right. At location 910 of the cursor, the route would violate against obstacles 912 and 902 if it followed the topology exactly. However, the solution found by TCLP, shown in FIG. 9F, moves both the via and the bend slightly from their user-specified locations, to find a legal route. Both blocking shapes are highlighted, and the route hugs both shapes at minimum design rule spacing.

The optimal line probing (OLP) technique, combines the best properties of shape-based routers (zero start-up cost) and graph-based routers (guaranteed optimal paths). This technique is ideally suited for full-chip custom routing: finding high quality routes for a relatively small number of critical nets, at the top level of a large system-on-chip design. The approach to interactive routing splits up the problem into two sub-parts—topology creation/update based on user inputs, and topology-constrained line probe search. This strategy leads to fast, predictable and area-efficient routing, while reducing eye and hand strain for the user. The productivity boost from embodiments described herein are expected to have a measurable impact on chip design cycle times. Apart from providing direct benefits to users, the topology-centric approach used in the embodiments described herein also lays an architectural foundation for interactive routing that enables one to build powerful new WYSIWYG editing features, such as bus routing with interleaving, shielded and matched routing, interactive shove-aside routing, and automatic re-routing when the floorplan changes.

Figure 10A:
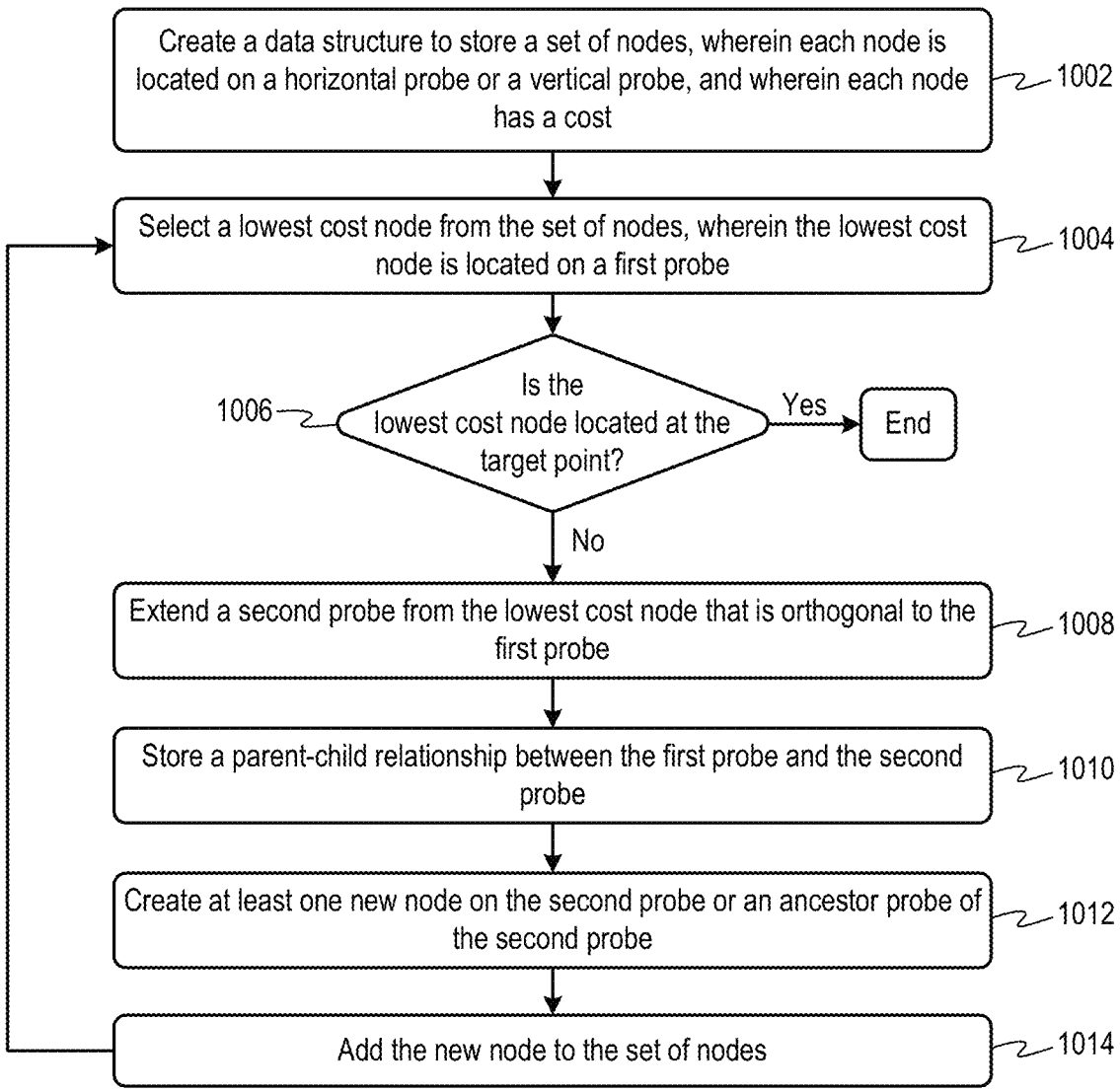
FIGS. 10A-10B illustrate processes for facilitating real-time interactive routing using topology-driven line probing in accordance with some embodiments described herein.
Figure 10B:
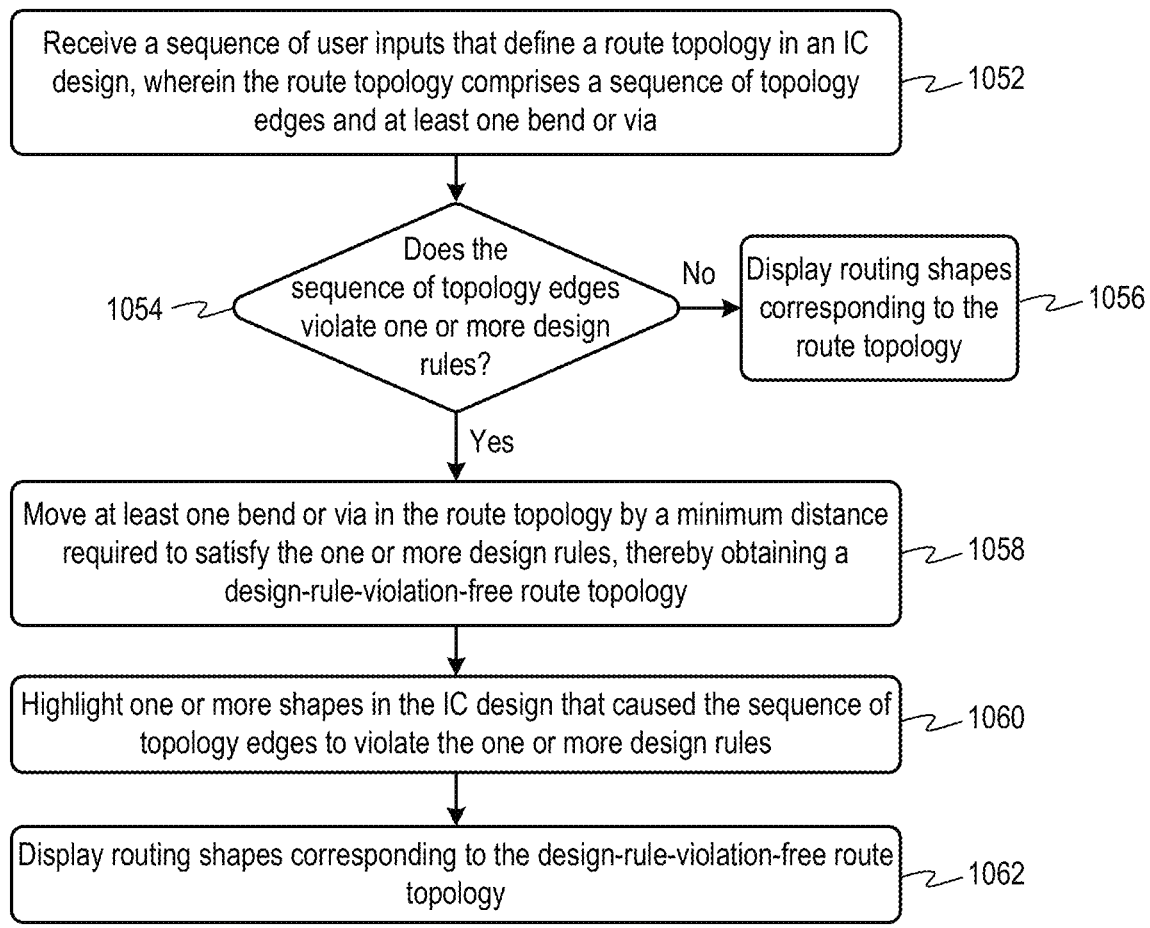

FIGS. 10A-10B illustrate processes for real-time interactive routing using topology-driven line probing in accordance with some embodiments described herein.

The process in FIG. 10A can begin by creating a data structure to store a set of nodes, wherein each node is located on a horizontal probe or a vertical probe, and wherein each node has a cost (step 1002). In some embodiments, the cost of each node is equal to a sum of (1) a first cost of a first route from the start point to the node, and (2) a lower bound of a second cost of a second route from the node to the target point. In some embodiments, the data structure is a priority queue, wherein lower cost corresponds to higher priority so that the lowest cost node is a highest priority node.

Next, the process can perform a set of operations in an iterative loop (steps 1004-1014). Specifically, the process can select a lowest cost node from the set of nodes, wherein the lowest cost node is located on a first probe (step 1004). Next, the process can check if the lowest cost node is located at the target point (step 1006). If so, the process can terminate the iterative loop. Otherwise, the process can extend a second probe from the lowest cost node, wherein the second probe is orthogonal to the first probe (step 1008). The process can then store a parent-child relationship between the first probe and the second probe (step 1010).

Next, the process can create at least one new node on the second probe or an ancestor probe of the second probe (step 1012). The process can then add the new node to the set of nodes (step 1014). Next, the process can return back to step 1004 to perform the next iteration of the iterative loop. Specifically, in step 1012, the process can create the at least one new node by: (1) creating at least one new node comprises creating the new node on the second probe at a location where the second probe hits an obstacle, (2) creating the new node on the second probe at a location having an X coordinate or a Y coordinate of the target point, (3) creating the new node on an ancestor probe of the second probe (e.g., the first probe, or a parent of the first probe, or a grandparent of the first probe, and so forth) at a location having an X coordinate or a Y coordinate of an edge of an obstacle encountered by the second probe, and/or (4) creating the new node on the second probe at a location having an X coordinate or a Y coordinate of an edge of an obstacle encountered by an ancestor probe of the second probe.

Note that the second probe and the first probe can be on different routing layers of the IC design, and the different routing layers of the IC design can have different unit routing costs.

After the iterative loop terminates, the process can determine the route from the start point to the target point by tracing back a sequence of probes from the target point to the start point based on the stored parent-child relationships.

The process in FIG. 10B can begin by receiving a sequence of user inputs that define a route topology in an IC design, wherein the route topology comprises a sequence of topology edges and at least one bend or via (step 1052). Next, the process can check if the sequence of topology edges violates one or more design rules (step 1054). If no design rules have been violated, the process can display routing shapes corresponding to the route topology (step 1056). On the other hand, if one or more design rules have been violated, the process can move at least one bend or via in the route topology by a minimum distance required to satisfy the one or more design rules, thereby obtaining a design-rule-violation-free route topology (step 1058). Next, the process can highlight one or more shapes in the IC design that caused the sequence of topology edges to violate the one or more design rules (step 1060). The process can then display routing shapes corresponding to the design-rule-violation-free route topology (step 1062).

Figure 11:
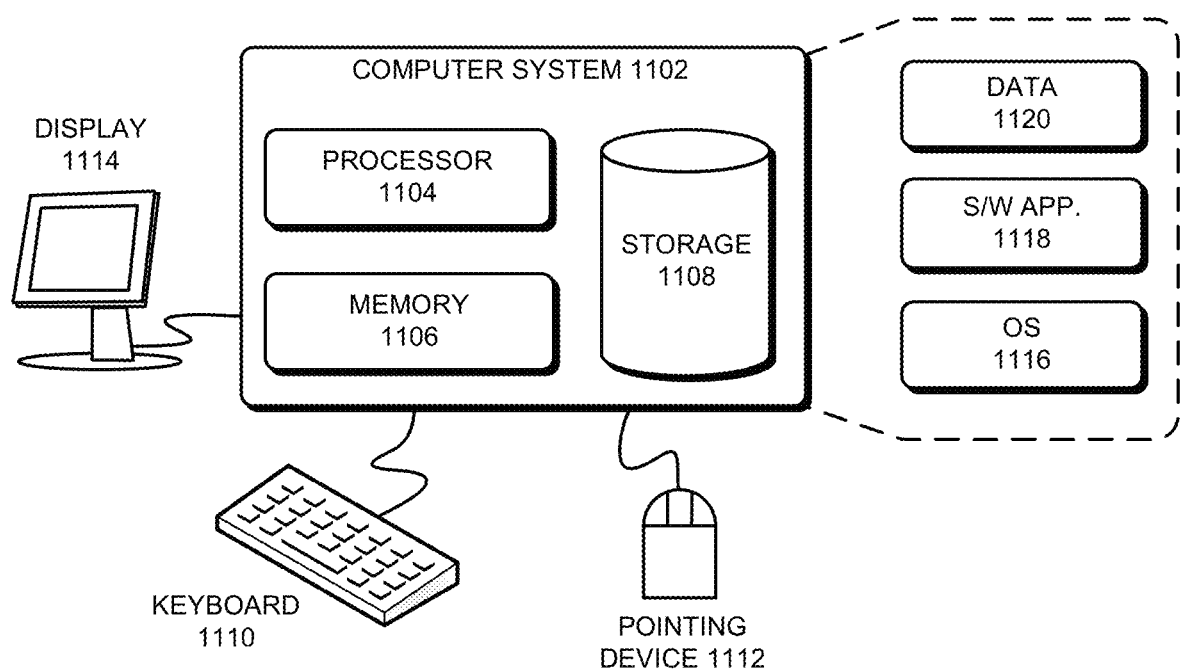
FIG. 11 illustrates a computer system in accordance with some embodiments described herein.

FIG. 11 illustrates a computer system in accordance with some embodiments described herein. The term "computer" or "computer system" generally refers to a hardware-based system that can perform computations required for the design and manufacture of ICs. Computer system 1102 can include processor 1104, memory 1106, and storage device 1108. Computer system 1102 may include multiple processors, and processor 1104 may include multiple cores. Specifically, memory locations in memory 1106 can be addressable by processor 1104, thereby enabling processor 1104 to access (e.g., via load/store instructions) and manipulate (e.g., via logical/floating point/arithmetic instructions) the data stored in memory 1106. Computer system 1102 can be coupled to display device 1114, keyboard 1110, and pointing device 1112. Storage device 1108 can store operating system 1116, software application 1118, and data 1120. Data 1120 can include input required by software application 1118 and/or output generated by software application 1118.

Computer system 1102 may automatically (or with user help) perform one or more operations that are implicitly or explicitly described in this disclosure. Specifically, computer system 1102 can load software application 1118 into memory 1106, and software application 1118 can then be used to create routes in an IC design. The resulting IC design is expected to have better performance and/or quality of results (QoR) because the routes were created by an IC routing tool that features real-time interactive routing using topology-driven optimal line probing.

While 'data' and 'information' often are used interchangeably (e.g., 'data processing' and 'information processing'), the term 'datum' (plural 'data') typically signifies a representation of the value of a measurement of a physical quantity (e.g., the current in a wire), or the answer to a question (e.g., "yes" or "no"), while the term 'information' typically signifies a structured set of data (often times signified by 'data structure'). A specified data structure is used to structure an electronic device to be used as a specific machine as an article of manufacture (see In re Lowry, 32 F.3d 1579 [CAFC, 1994]). Data and information are physical, for example binary data (a 'bit', usually signified with '0' and '1') enabled with two different levels of voltage in a circuit. For example, data can be enabled as an electrical, magnetic, optical or acoustical signal; a quantum state such as spin that enables a 'qubit'; or a physical state of an atom or molecule. All such data and information, when enabled, are stored, accessed, transferred, combined, compared, or otherwise acted upon, actions that require energy.

As used herein, the term 'process' signifies an unnatural sequence of physical actions and/or transformations (both also referred to as 'operations' or 'steps') to produce at least one result. The actions and transformations are technical applications of one or more natural laws of science or unnatural laws of technology. The actions and transformations often change the physical state of a machine, of structures of data and information, or of a composition of matter. Two or more actions can occur at about the same time, or one action can occur before or after another action, if they produce the same result. A description of the physical actions and/or transformations that comprise a process are often signified with a set of gerund phrases (or their semantic equivalents) that are typically preceded with the signifier 'the steps of' (e.g., "a process comprising the steps of measuring, transforming, partitioning and then distributing . . . "). The signifiers 'algorithm', 'method', 'procedure', '(sub)routine', 'protocol', 'recipe', and 'technique' often are used interchangeably with 'process', and 35 U.S.C. 100 defines a "method" as one type of process that is, by statutory law, always patentable under 35 U.S.C. 101. Many forms of knowledge, learning, skills and styles are authored, structured, and enabled—objectively—as processes—e.g., knowledge and learning as functions in knowledge programming languages. As used herein, the term 'rule' signifies a process with at least one conditional test (signified, e.g., by 'IF test THEN process'). As used herein, the term 'thread' signifies a sequence of operations or instructions that comprise a subset of an entire process. A process can be partitioned into multiple threads that can be used at or about the same time.

As used herein, the term 'component' (also signified by 'part', and typically signified by 'element' when described in a patent text or diagram) signifies a physical object that is used to enable a process in combination with other components. For example, electronic components are used in processes that affect the physical state of one or more ('ensemble') electromagnetic or quantum particles/waves (e.g., electrons, photons) or quasiparticles (e.g., electron holes, phonons, magnetic domains) and their associated fields or signals. Electronic components have at least two connection points to which are attached 'leads', typically a wire with one end attached to the component and the other end attached to another component, typically as part of a circuit with current flows. There are at least three types of electrical components: passive, active and electromechanical. Passive electronic components typically do not introduce energy into a circuit—such components include resistors, memristors, capacitors, magnetic inductors, crystals, Josephson junctions, transducers, sensors, antennas, waveguides, etc. Active electronic components require a source of energy and can inject energy into a circuit—such components include semiconductors (e.g., diodes, transistors, optoelectronic devices), vacuum tubes, batteries, power supplies, displays (e.g., LEDs, LCDs, lamps, CRTs, plasma displays). Electromechanical components affect current flow using mechanical forces and structures—such components include switches, relays, protection devices (e.g., fuses, circuit breakers), heat sinks, fans, cables, wires, terminals, connectors and printed circuit boards. As used herein, the term 'netlist' is a specification of the components comprising an electric circuit, and electrical connections between the components. The programming language for the SPICE circuit simulation program is often used to specify a netlist. In the context of circuit design, the term 'instance' signifies each time a component is specified in a netlist.

One of the most important components as goods in commerce is the integrated circuit, and its res of abstractions. As used herein, the term 'integrated circuit' signifies a set of connected electronic components on a small substrate (thus the use of the signifier 'chip') of semiconductor material, such as silicon or gallium arsenide, with components fabricated on one or more layers. Other signifiers for 'integrated circuit' include 'monolithic integrated circuit', 'IC', 'chip', 'microchip' and 'System on Chip' ('SoC'). Types of integrated circuits include gate/logic arrays, processors, memories, interface chips, power controllers, and operational amplifiers. The term 'cell' as used in electronic circuit design signifies a specification of one or more components, for example, a set of transistors that are connected to function as a logic gate. Cells are usually stored in a database, to be accessed by circuit designers and design processes.

As used herein, the term 'module' signifies a tangible structure for acting on data and information that typically is limited in size and/or complexity.

For example, the term 'module' can signify one or more processes that transforms data and information, for example, processes comprising a computer program. The term 'module' also can signify one or more interconnected electronic components, such as digital logic devices. A process comprising a module, if specified in a programming language, such as System C or Verilog, also can be transformed into a specification for a structure of electronic components that transform data and information that produce the same result as the process. This last sentence follows from a modified Church-Turing thesis, which is simply expressed as "Whatever can be transformed by a (patentable) process and a processor, can be transformed by a (patentable) equivalent set of modules.", as opposed to the doublethink of deleting only one of the "(patentable)".

A module is permanently structured (e.g., circuits with unalterable connections), temporarily structured (e.g., circuits or processes that are alterable with sets of data), or a combination of the two forms of structuring. Permanently structured modules can be manufactured, for example, using Application Specific Integrated Circuits ('ASICs') such as Arithmetic Logic Units ('ALUs'), Programmable Logic Arrays ('PLAs'), or Read Only Memories ('ROMs'), all of which are typically structured during manufacturing. For example, a permanently structured module can comprise an integrated circuit. Temporarily structured modules can be manufactured, for example, using Field Programmable Gate Arrays (FPGAs—for example, sold by Xilink or Intel's Altera), Random Access Memories (RAMs) or microprocessors. For example, data and information is transformed using data as an address in RAM or ROM memory that stores output data and information. One can embed temporarily structured modules in permanently structured modules (for example, a FPGA embedded into an ASIC).

Modules that are temporarily structured can be structured during multiple time periods. For example, a processor comprising one or more modules has its modules first structured by a manufacturer at a factory and then further structured by a user when used in commerce. The processor can comprise a set of one or more modules during a first time period, and then comprise a different set of one or modules during a second time period. The decision to manufacture or implement a module in a permanently structured form, in a temporarily structured form, or in a combination of the two forms, depends on issues of commerce such as cost, time considerations, resource constraints, tariffs, maintenance needs, national intellectual property laws, and/or specific design goals. How a module is used is mostly independent of the physical form in which it is manufactured or enabled. This last sentence also follows from the modified Church-Turing thesis.

As used herein, the term 'processor' signifies a tangible data and information processing machine for use in commerce that physically transforms, transfers, and/or transmits data and information, using at least one process. A processor comprises one or more modules (e.g., a central processing unit, 'CPU'; an input/output ('I/O') controller, a memory controller, a network controller, and other modules). The term 'processor' can signify one or more processors, or one or more processors with multiple computational cores/CPUs, specialized processors (for example, graphics processors or signal processors), and their combinations. Where two or more processors interact, one or more of the processors can be remotely located. Where the term 'processor' is used in another context, such as a 'chemical processor', it will be signified and defined in that context.

The processor can comprise, for example, digital logic circuitry (for example, a binary logic gate), and/or analog circuitry (for example, an operational amplifier). The processor also can use optical signal processing, DNA transformations or quantum operations, microfluidic logic processing, or a combination of technologies, such as an optoelectronic processor. For data and information structured with binary data, any processor that can transform data and information using the AND, OR and NOT logical operations (and their derivatives, such as the NAND, NOR, and XOR operations) also can transform data and information using any function of Boolean logic. A processor such as an analog processor, such as an artificial neural network, also can transform data and information. No scientific evidence exists that any of these technological processors are processing, storing and retrieving data and information, using any process or structure equivalent to the bioelectric structures and processes of the human brain.

The one or more processors also can use a process in a 'cloud computing' environment, where time and resources of multiple remote computers are shared by multiple users or processors communicating with the computers. For example, a group of processors can use at least one process available at a distributed or remote system, these processors using a communications network (e.g., the Internet, or an Ethernet) and using one or more specified interfaces (e.g., an application program interface ('API') that signifies functions and data structures to communicate with the remote process).

As used herein, the term 'computer' and 'computer system' (further defined below) includes at least one processor that, for example, performs operations on data and information such as (but not limited to) the AND, OR and NOT logical operations using electronic gates that can comprise transistors, with the addition of memory (for example, memory structured with flip-flops using the NOT-AND or NOT-OR operation). Such a processor is Turing-complete and computationally universal. A computer can comprise a simple structure, for example, comprising an I/O module, a CPU, and a memory that performs, for example, the process of inputting a signal, transforming the signal, and outputting the signal with no human intervention.

As used herein, the term 'programming language' signifies a structured grammar for specifying sets of operations and data for use by modules, processors and computers. Programming languages include assembler instructions, instruction-set-architecture instructions, machine instructions, machine dependent instructions, microcode, firmware instructions, state-setting data, or either source code or object code written in any combination of one or more higher level languages, for example, the C programming language and similar general programming languages (such as Fortran, Basic, Javascript, PHP, Python, C++), knowledge programming languages (such as Lisp, Smalltalk, Prolog, or CycL), electronic structure programming languages (such as VHDL, Verilog, SPICE or SystemC), text programming languages (such as SGML, HTML, or XML), or audiovisual programming languages (such as SVG, MathML, X3D/VRML, or MIDI), and any future equivalent programming languages. As used herein, the term 'source code' signifies a set of instructions and data specified in text form using a programming language. A large amount of source code for use in enabling any of the claimed inventions is available on the Internet, such as from a source code library such as Github.

As used herein, the term 'program' (also referred to as an 'application program') signifies one or more processes and data structures that structure a module, processor or computer to be used as a "specific machine" (see In re Alappat, 33 F3d 1526 [CAFC, 1991]). One use of a program is to structure one or more computers, for example, standalone, client or server computers, or one or more modules, or systems of one or more such computers or modules. As used herein, the term 'computer application' signifies a program that enables a specific use, for example, to enable text processing operations, or to encrypt a set of data. As used herein, the term 'firmware' signifies a type of program that typically structures a processor or a computer, where the firmware is smaller in size than a typical application program, and is typically not very accessible to or modifiable by the user of a computer. Computer programs and firmware are often specified using source code written in a programming language, such as C. Modules, circuits, processors, programs, and computers can be specified at multiple levels of abstraction, for example, using the SystemC programming language, and have value as products in commerce as taxable goods under the Uniform Commercial Code (see U.C.C. Article 2, Part 1).

A program is transferred into one or more memories of the computer or computer system from a data and information device or storage system. A computer system typically has a device for reading storage media that is used to transfer the program, and/or has an interface device that receives the program over a network. This process is discussed in the General Computer Explanation section.

The signifier 'commercial solution' signifies, solely for the following paragraph, an engineering domain-specific (and thus non-preemptive—see Bilski): electronic structure, a process for a specified machine, a manufacturable circuit (and their Church-Turing equivalents) or a composition of matter that applies science and/or technology in commerce to solve a technical problem.

The signifier 'abstract' (when used in a patent claim for any enabled embodiments disclosed herein for a new commercial solution that is a scientific use of one or more laws of nature {see Benson}, and that solves a problem of technology {see Diehr} used in commerce—or improves upon an existing commercial solution {see Diehr})—is precisely defined by the inventor(s) {see MPEP 2111.01 (9th edition, Rev. 08.2017)} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is 'difficult to understand' {see Merriam-Webster definition for 'abstract'} how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art publications that can be combined {see Alice} by a skilled person {often referred to as a 'PHOSITA', see MPEP 2141-2144 (9th edition, Rev. 08.2017)} to be equivalent to the new commercial solution, and is thus unpatentable under 35 U.S.C. 103, for example, because it is 'difficult to understand' how the new commercial solution differs from a PHOSITA-combination/-application of the existing prior art; or c) a new commercial solution is 'abstract' if it is not disclosed with a description that enables its praxis, either because insufficient guidance exists in the description, or because only a generic implementation is described {see Mayo} with unspecified components, parameters or functionality, so that a PHOSITA is unable to instantiate an embodiment of the new solution for use in commerce, without, for example, requiring special programming {see Katz} (or, e.g., circuit design) to be performed by the PHOSITA, and is thus unpatentable under 35 U.S.C. 112, for example, because it is 'difficult to understand' how to use in commerce any embodiment of the new commercial solution.

The Detailed Description signifies in isolation the individual features, structures, functions, or characteristics described herein and any combination of two or more such features, structures, functions or characteristics, to the extent that such features, structures, functions or characteristics or combinations thereof are enabled by the Detailed Description as a whole in light of the knowledge and understanding of a skilled person, irrespective of whether such features, structures, functions or characteristics, or combinations thereof, solve any problems disclosed herein, and without limitation to the scope of the Claims of the patent. When an embodiment of a claimed invention comprises a particular feature, structure, function or characteristic, it is within the knowledge and understanding of a skilled person to use such feature, structure, function, or characteristic in connection with other embodiments whether or not explicitly described, for example, as a substitute for another feature, structure, function or characteristic.

In view of the Detailed Description, a skilled person will understand that many variations of the claimed inventions can be enabled, such as function and structure of elements, described herein while remaining in the domain of the claimed inventions. One or more elements of an embodiment can be substituted for one or more elements in another embodiment, as will be understood by a skilled person. Writings about embodiments signify their uses in commerce, thereby enabling other skilled people to similarly use in commerce.

This Detailed Description is fitly written to provide knowledge and understanding. It is neither exhaustive nor limiting of the precise structures described, but is to be accorded the widest scope consistent with the disclosed principles and features. A skilled person can enable many equivalent variations. Without limitation, any and all equivalents described, signified or Incorporated By Reference in this patent application are specifically Incorporated By Reference into the Detailed Description. In addition, any and all variations described, signified or Incorporated By Reference with respect to any one claimed invention and its embodiment also are included with all other claimed inventions and their embodiments. Any such variations include both currently known variations as well as future variations, for example any element used for enablement includes a future equivalent element that provides the same function, regardless of the structure of the future equivalent element.

It is intended that the domain of the set of claimed inventions and their embodiments be defined and judged by the following Claims and their equivalents. The Detailed Description includes the following Claims, with each Claim standing on its own as a separate claimed invention. The embodiments of the claimed inventions can have more structure and features than are explicitly specified in the Claims.

The foregoing embodiments have been presented for purposes of illustration and description. They are not intended to be exhaustive or to limit the scope of this disclosure to the forms disclosed. Accordingly, many modifications and variations will be apparent to practitioners skilled in the art. Additionally, the above disclosure is not intended to limit the disclosed subject matter. The scope of the claimed invention(s) is defined by the appended claims.

What is claimed is:

1. A non-transitory computer-readable storage medium storing instructions that, when executed by a computer, cause the computer to perform a method for determining a route from a start point to a target point in an integrated circuit (IC) design using topology-driven line probing, the method comprising:
    creating a data structure to store a set of nodes, wherein each node is located on a horizontal probe or a vertical probe, and wherein each node has a cost; and
    performing a set of operations in an iterative loop, the set of operations comprising:
        selecting a lowest cost node from the set of nodes, wherein the lowest cost node is located on a first probe;
        terminating the iterative loop if the lowest cost node is located at the target point;
        extending a second probe from the lowest cost node, wherein the second probe is orthogonal to the first probe;
        storing a parent-child relationship between the first probe and the second probe;
        creating at least one new node on the second probe or an ancestor probe of the second probe; and
        adding the new node to the set of nodes.

2. The non-transitory computer-readable storage medium of claim 1, wherein the cost of each node is equal to a sum of (1) a first cost of a first route from the start point to the node, and (2) a lower bound of a second cost of a second route from the node to the target point.

3. The non-transitory computer-readable storage medium of claim 1, wherein said creating at least one new node comprises creating the new node on the second probe at a location where the second probe hits an obstacle.

4. The non-transitory computer-readable storage medium of claim 1, wherein said creating at least one new node comprises creating the new node on the second probe at a location having an X coordinate or a Y coordinate of the target point.

5. The non-transitory computer-readable storage medium of claim 1, wherein said creating at least one new node comprises one or more of: (1) creating the new node on an ancestor probe of the second probe at a location having an X coordinate or a Y coordinate of an edge of an obstacle encountered by the second probe, and (2) creating the new node on the second probe at a location having an X coordinate or a Y coordinate of an edge of an obstacle encountered by an ancestor probe of the second probe.

6. The non-transitory computer-readable storage medium of claim 1, wherein the second probe and the first probe are on different routing layers of the IC design.

7. The non-transitory computer-readable storage medium of claim 6, wherein the different routing layers of the IC design have different unit routing costs.

8. The non-transitory computer-readable storage medium of claim 1, wherein the data structure is a priority queue, wherein lower cost corresponds to higher priority so that the lowest cost node is a highest priority node in the priority queue.

9. The non-transitory computer-readable storage medium of claim 1, wherein the method further comprises determining the route from the start point to the target point by tracing back a sequence of probes from the target point to the start point based on the parent-child relationships.

10. A method for determining a route from a start point to a target point in an integrated circuit (IC) design using topology-driven line probing, the method comprising:
    creating, by using a computer, a data structure to store a set of nodes, wherein each node is located on a horizontal probe or a vertical probe, and wherein each node has a cost; and
    performing a set of operations in an iterative loop, the set of operations comprising:
        selecting a lowest cost node from the set of nodes, wherein the lowest cost node is located on a first probe;
        terminating the iterative loop if the lowest cost node is located at the target point;

extending a second probe from the lowest cost node, wherein the second probe is orthogonal to the first probe;

storing a parent-child relationship between the first probe and the second probe;

creating at least one new node on the second probe or an ancestor probe of the second probe; and adding the new node to the set of nodes.

11. The method of claim 10, wherein the cost of each node is equal to a sum of (1) a first cost of a first route from the start point to the node, and (2) a lower bound of a second cost of a second route from the node to the target point.

12. The method of claim 10, wherein said creating at least one new node comprises creating the new node on the second probe at a location where the second probe hits an obstacle.

13. The method of claim 10, wherein said creating at least one new node comprises creating the new node on the second probe at a location having an X coordinate or a Y coordinate of the target point.

14. The method of claim 10, wherein said creating at least one new node comprises one or more of: (1) creating the new node on an ancestor probe of the second probe at a location having an X coordinate or a Y coordinate of an edge of an obstacle encountered by the second probe, and (2) creating the new node on the second probe at a location having an X coordinate or a Y coordinate of an edge of an obstacle encountered by an ancestor probe of the second probe.

15. The method of claim 10, wherein the second probe and the first probe are on different routing layers of the IC design.

16. The method of claim 15, wherein the different routing layers of the IC design have different unit routing costs.

17. The method of claim 10, wherein the data structure is a priority queue, wherein lower cost corresponds to higher priority so that the lowest cost node is a highest priority node in the priority queue.

18. The method of claim 10, wherein the method further comprises determining the route from the start point to the target point by tracing back a sequence of probes from the target point to the start point based on the parent-child relationships.

19. An apparatus, comprising:

a processor; and a non-transitory computer-readable storage medium storing instructions that, when executed by the processor, cause the apparatus to perform a method for determining a route from a start point to a target point in an integrated circuit (IC) design using topology-driven line probing, the method comprising:

creating a data structure to store a set of nodes, wherein each node is located on a horizontal probe or a vertical probe, and wherein each node has a cost; and performing a set of operations in an iterative loop, the set of operations comprising:

selecting a lowest cost node from the set of nodes, wherein the lowest cost node is located on a first probe;

terminating the iterative loop if the lowest cost node is located at the target point;

extending a second probe from the lowest cost node, wherein the second probe is orthogonal to the first probe;

storing a parent-child relationship between the first probe and the second probe;

creating at least one new node on the second probe or an ancestor probe of the second probe; and adding the new node to the set of nodes.

20. The apparatus of claim 19, wherein the data structure is a priority queue, wherein lower cost corresponds to higher priority so that the lowest cost node is a highest priority node in the priority queue, wherein the second probe and the first probe are on different routing layers of the IC design, wherein the different routing layers of the IC design have different unit routing costs, and wherein the cost of each node is equal to a sum of (1) a first cost of a first route from the start point to the node, and (2) a lower bound of a second cost of a second route from the node to the target point.

* * * * *